US012604448B2

(12) United States Patent
Yang

(10) Patent No.: US 12,604,448 B2
(45) Date of Patent: Apr. 14, 2026

(54) DISPLAY MODULE, MANUFACTURING METHOD THEREOF, AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Wenhua Yang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1002 days.

(21) Appl. No.: 17/618,483

(22) PCT Filed: Dec. 7, 2021

(86) PCT No.: PCT/CN2021/136206
§ 371 (c)(1),
(2) Date: Dec. 12, 2021

(87) PCT Pub. No.: WO2023/092650
PCT Pub. Date: Jun. 1, 2023

(65) Prior Publication Data
US 2024/0015940 A1      Jan. 11, 2024

(30) Foreign Application Priority Data
Nov. 26, 2021      (CN) .......................... 202111418066.9

(51) Int. Cl.
*H05K 9/00* (2006.01)
*C09J 9/02* (2006.01)
(Continued)

(52) U.S. Cl.
CPC .............. *H05K 9/0079* (2013.01); *C09J 9/02* (2013.01); *C09J 11/06* (2013.01); *C09J 11/08* (2013.01);
(Continued)

(58) Field of Classification Search
None
See application file for complete search history.

(56) References Cited

U.S. PATENT DOCUMENTS

2009/0029129 A1    1/2009  Pellerite et al.
2009/0068381 A1*   3/2009  Yi ............................ G02B 1/16
                                                        428/1.31
(Continued)

FOREIGN PATENT DOCUMENTS

CN      101419304 A     4/2009
CN      104765093 A     7/2015
(Continued)

OTHER PUBLICATIONS

International Search Report in International application No. PCT/CN2021/136206, mailed on Aug. 25, 2022.
(Continued)

*Primary Examiner* — Eli D. Strah
(74) *Attorney, Agent, or Firm* — PV IP PC; Peter Stecher; Wei Te Chung

(57) ABSTRACT

A display module and a mobile terminal are disclosed. The display module includes a display panel, a polarizing layer disposed on a first side of the display panel, and a backplate layer disposed on a second side of the display panel, and the polarizing layer or/and the backplate layer includes an antistatic agent. By adding the antistatic agent into the polarizing layer or/and the backplate layer, the present disclosure reduces an impedance value of the polarizing layer or/and the backplate layer, improves an antistatic
(Continued)

effect, thereby improving overall photoelectric performances of the display module.

14 Claims, 2 Drawing Sheets

(51) Int. Cl.
  *C09J 11/06* (2006.01)
  *C09J 11/08* (2006.01)
(52) U.S. Cl.
  CPC .... *C09J 2203/326* (2013.01); *C09J 2301/408* (2020.08)

(56) References Cited

U.S. PATENT DOCUMENTS

| | | | | |
|---|---|---|---|---|
| 2019/0019450 A1* | 1/2019 | Ahn | .......... | H10K 30/865 |
| 2020/0033674 A1* | 1/2020 | Fujita | .......... | G02B 1/14 |
| 2021/0257596 A1* | 8/2021 | Tang | .......... | G02F 1/133528 |
| 2023/0203347 A1* | 6/2023 | Katami | .......... | B32B 27/286 |
| | | | | 428/40.1 |

FOREIGN PATENT DOCUMENTS

| | | | | | |
|---|---|---|---|---|---|
| CN | 110289368 A | | 9/2019 | | |
| CN | 111009186 A | | 4/2020 | | |
| CN | 112271270 A | | 1/2021 | | |
| TW | 200912398 A | | 3/2009 | | |
| WO | 2020056599 A1 | | 3/2020 | | |
| WO | WO-2020042232 A1 | * | 3/2020 | .......... | G02B 5/3041 |
| WO | WO-2021193747 A1 | * | 9/2021 | .......... | B32B 25/08 |

OTHER PUBLICATIONS

Written Opinion of the International Search Authority in International application No. PCT/CN2021/136206, mailed on Aug. 25, 2022.

Chinese Office Action issued in corresponding Chinese Patent Application No. 202111418066.9 dated Jun. 7, 2022, pp. 1-10.

* cited by examiner

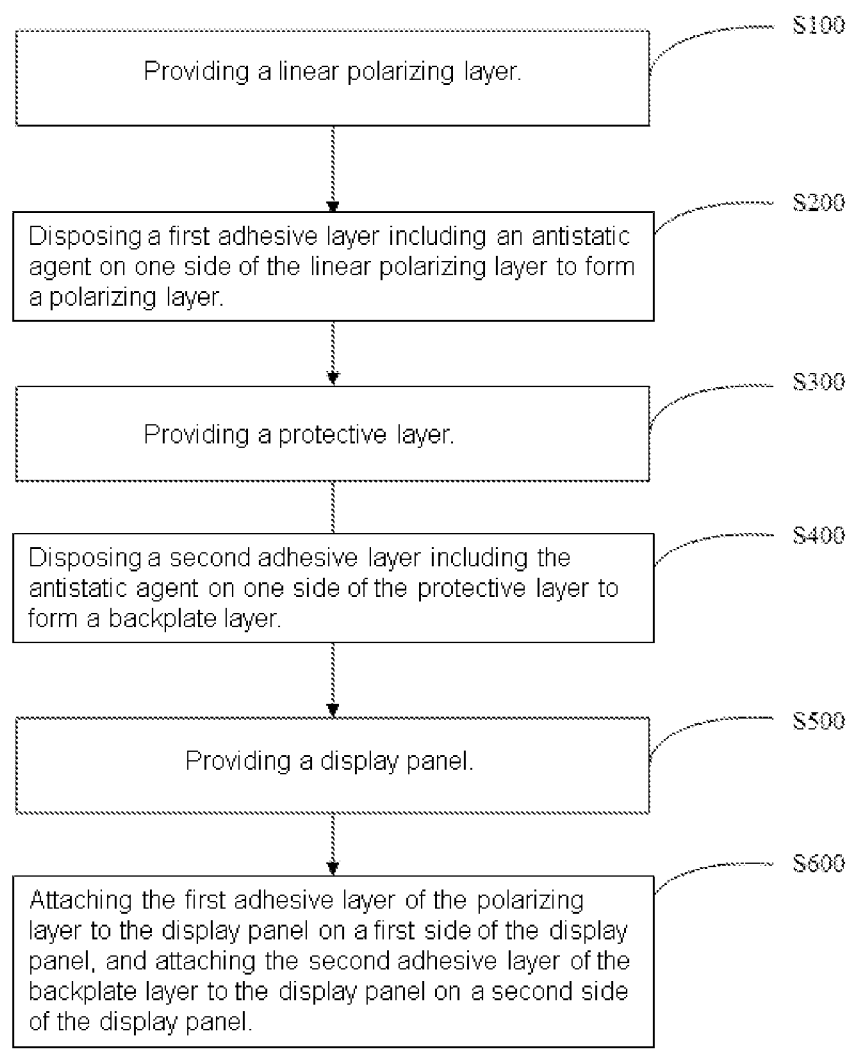

Providing a linear polarizing layer. — S100

Disposing a first adhesive layer including an antistatic agent on one side of the linear polarizing layer to form a polarizing layer. — S200

Providing a protective layer. — S300

Disposing a second adhesive layer including the antistatic agent on one side of the protective layer to form a backplate layer. — S400

Providing a display panel. — S500

Attaching the first adhesive layer of the polarizing layer to the display panel on a first side of the display panel, and attaching the second adhesive layer of the backplate layer to the display panel on a second side of the display panel. — S600

FIG. 3

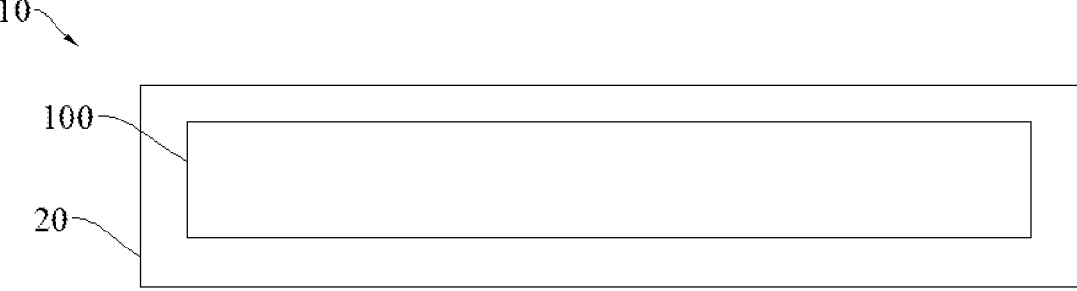

FIG. 4

DISPLAY MODULE, MANUFACTURING METHOD THEREOF, AND MOBILE TERMINAL

FIELD OF INVENTION

The present disclosure relates to the field of display technologies, and more particularly, to a display module, a manufacturing method thereof, and a mobile terminal.

BACKGROUND OF INVENTION

In recent years, organic light-emitting diode (OLED) display modules are popular with consumers due to their low power consumption, fast response times, and an ability to realize high-resolution display. In a structure of display modules, polarizers are disposed to reduce reflected light and improve display effects, and backplates have protecting effects on display panels. The polarizers and the backplates are respectively disposed on both sides of the display panels, which will cause a photoelectric effect on the display panels. In photoelectric research, it is found that the photoelectric effect is related to module material electrical properties of the two, so it is necessary to reduce an impedance value of module materials of the polarizers or the backplates to improve overall photoelectric performances of the display modules.

Therefore, it is necessary to provide a display module and a mobile terminal to solve the above technical problem.

Technical problem: the present disclosure provides a display module, a manufacturing method thereof, and a mobile terminal to relieve a technical problem of impedance values of the polarizers and the backplates being large.

SUMMARY OF INVENTION

To solve the above problems, an embodiment of the present disclosure provides following technical solutions.

An embodiment of the present disclosure provides a display module, which includes:

a display panel;

a polarizing layer disposed on a first side of the display panel; and a backplate layer disposed on a second side of the display panel;

wherein, the polarizing layer or/and the backplate layer includes an antistatic agent.

Preferably, the antistatic agent is disposed in a film layer of the polarizing layer on one side adjacent to the display panel, or/and the antistatic agent is disposed in a film layer of the backplate layer on one side adjacent to the display panel.

Preferably, the polarizing layer includes a linear polarizing layer and a first adhesive layer disposed between the linear polarizing layer and the display panel, and the antistatic agent is disposed in the first adhesive layer; or/and the backplate layer includes a protective layer and a second adhesive layer disposed between the protective layer and the display panel, and the antistatic agent is disposed in the second adhesive layer.

Preferably, in a direction from the linear polarizing layer to the display panel, an amount of the antistatic agent in the first adhesive layer is gradually increased; or/and in a direction from the protective layer to the display panel, an amount of the antistatic agent in the second adhesive layer is gradually increased.

Preferably, the polarizing layer includes a first adhesive layer disposed on the display panel, a compensation layer disposed on the first adhesive layer, a third adhesive layer disposed on the compensation layer, a first support layer disposed on the third adhesive layer, a linear polarizing layer disposed on the first support layer, and a second support layer disposed on the linear polarizing layer; and at least one film layer of the first adhesive layer, the compensation layer, the third adhesive layer, the first support layer, the linear polarizing layer, or the second support layer is provided with the antistatic agent.

Preferably, the antistatic agent includes hydrophilic groups.

Preferably, the antistatic agent is one of an anionic surfactant, a cationic surfactant, an amphoteric surfactant, a non-ionic surfactant, or a silicone antistatic agent.

Preferably, the anionic surfactant is one of sodium alkyl sulfonate, sodium alkylbenzene sulfonate, alkyl sulfate, alkylphenol, polyvinyl chloride ether sulfate, or alkyl phosphate; the cationic surfactant is one of amine salts, quaternary ammonium salts, or alkyl amino acid salts; the amphoteric surfactant is one of amino acid type, betaine type, or imidazoline type; the non-ionic surfactant is ionic compounds containing hydroxyl or oxyethylene groups; and the silicone antistatic agent is one of copolymers of siloxane and polyoxyethylene ether, organosiloxane with sulfonic acid ends, organosiloxane with salt ends, or composite silicone.

Preferably, antistatic functional groups of the antistatic agent are positioned on ends of main chains of corresponding organic compounds, or the antistatic functional groups of the antistatic agent are positioned on ends of branched chains of the corresponding organic compounds.

Preferably, a mass percentage of the antistatic agent in a corresponding film layer ranges from 0.5% to 2.0%.

An embodiment of the present disclosure further provides a mobile terminal, which includes a display module and a terminal body, wherein, the display module and the terminal body are combined into one integrated structure;

the display module includes:

a display panel;

a polarizing layer disposed on a first side of the display panel; and a backplate layer disposed on a second side of the display panel;

wherein, the polarizing layer or/and the backplate layer includes an antistatic agent.

Preferably, the antistatic agent is disposed in a film layer of the polarizing layer on one side adjacent to the display panel, or/and the antistatic agent is disposed in a film layer of the backplate layer on one side adjacent to the display panel.

Preferably, the polarizing layer includes a linear polarizing layer and a first adhesive layer disposed between the linear polarizing layer and the display panel, and the antistatic agent is disposed in the first adhesive layer; or/and the backplate layer includes a protective layer and a second adhesive layer disposed between the protective layer and the display panel, and the antistatic agent is disposed in the second adhesive layer.

Preferably, in a direction from the linear polarizing layer to the display panel, an amount of the antistatic agent in the first adhesive layer is gradually increased; or/and in a direction from the protective layer to the display panel, an amount of the antistatic agent in the second adhesive layer is gradually increased.

Preferably, the polarizing layer includes a first adhesive layer disposed on the display panel, a compensation layer disposed on the first adhesive layer, a third adhesive layer disposed on the compensation layer, a first support layer disposed on the third adhesive layer, a linear polarizing layer disposed on the first support layer, and a second support layer disposed on the linear polarizing layer; and at least one film layer of the first adhesive layer, the compensation layer, the third adhesive layer, the first support layer, the linear polarizing layer, or the second support layer is provided with the antistatic agent.

Preferably, the antistatic agent includes hydrophilic groups.

Preferably, the antistatic agent is one of an anionic surfactant, a cationic surfactant, an amphoteric surfactant, a non-ionic surfactant, or a silicone antistatic agent.

Preferably, the anionic surfactant is one of sodium alkyl sulfonate, sodium alkylbenzene sulfonate, alkyl sulfate, alkylphenol, polyvinyl chloride ether sulfate, or alkyl phosphate; the cationic surfactant is one of amine salts, quaternary ammonium salts, or alkyl amino acid salts; the amphoteric surfactant is one of amino acid type, betaine type, or imidazoline type; the non-ionic surfactant is ionic compounds containing hydroxyl or oxyethylene groups; and the silicone antistatic agent is one of copolymers of siloxane and polyoxyethylene ether, organosiloxane with sulfonic acid ends, organosiloxane with salt ends, or composite silicone.

Preferably, antistatic functional groups of the antistatic agent are positioned on ends of main chains of corresponding organic compounds, or the antistatic functional groups of the antistatic agent are positioned on ends of branched chains of the corresponding organic compounds.

Preferably, a mass percentage of the antistatic agent in a corresponding film layer ranges from 0.5% to 2.0%.

Beneficial effect: by adding the antistatic agent into the polarizing layer or/and the backplate layer, the present disclosure reduces an impedance value of the polarizing layer or/and the backplate layer, improves an antistatic effect, thereby improving overall photoelectric performances of the display module.

DESCRIPTION OF DRAWINGS

FIG. 3 is a flowchart of a manufacturing method of the display module according to an embodiment of the present disclosure.

FIG. 4 is a schematic structural diagram of a mobile terminal according to an embodiment of the present disclosure.

DETAILED DESCRIPTION OF PREFERRED EMBODIMENTS

The present disclosure provides a display module, a manufacturing method thereof, and a mobile terminal. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

An embodiment of the present disclosure provides a display module, a manufacturing method thereof, and a mobile terminal. They will be described in detail in the following. It should be noted that an order of description in the following embodiments is not meant to limit a preferred order of the embodiments.

Figure 1:
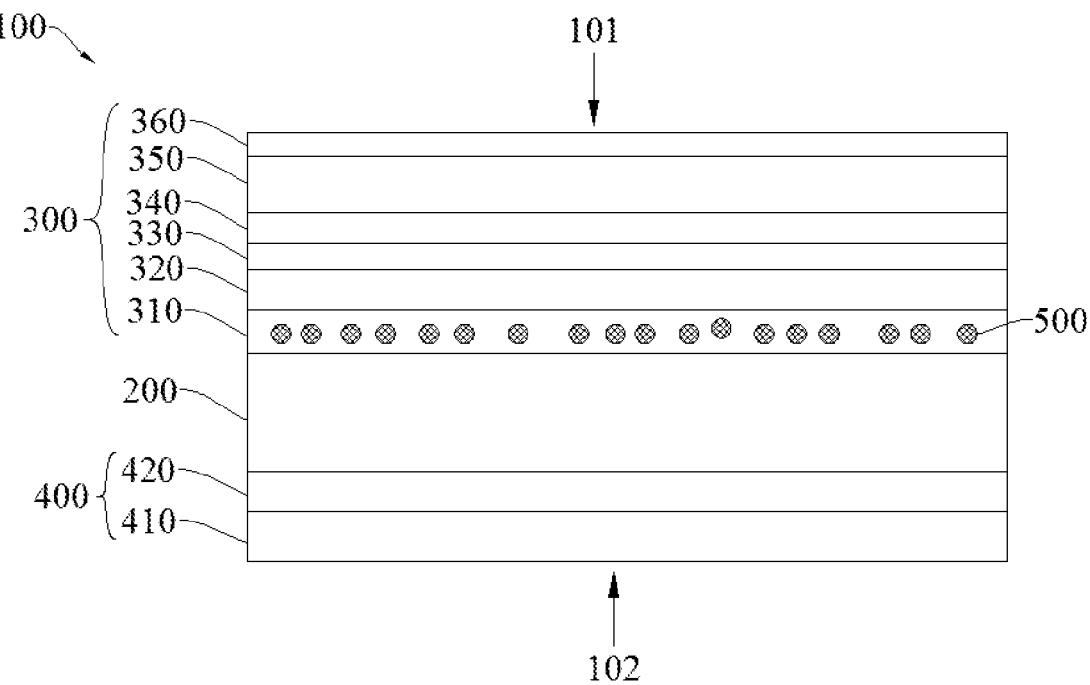
FIG. 1 is a schematic structural diagram of a first structure of a display module according to an embodiment of the present disclosure.
Figure 2:
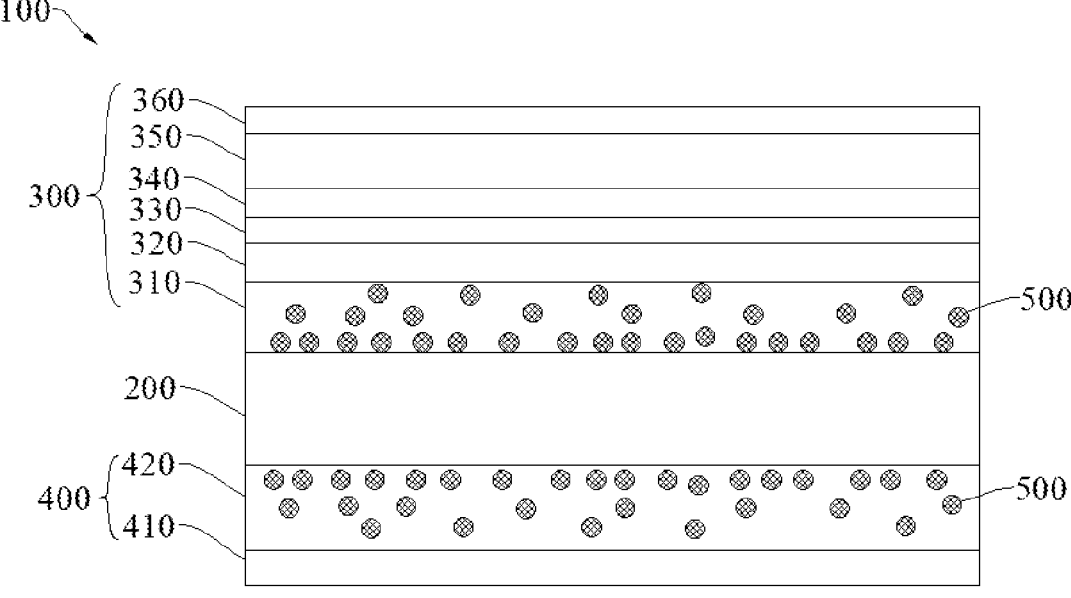
FIG. 2 is a schematic structural diagram of a second structure of the display module according to an embodiment of the present disclosure.

Referring to FIGS. 1 and 2, an embodiment of the present disclosure provides the display module 100, which includes:
a display panel 200;
a polarizing layer 300 disposed on a first side 101 of the display panel 200; and
a backplate layer 400 disposed on a second side 102 of the display panel 200;
wherein, the polarizing layer 300 or/and the backplate layer 400 includes an antistatic agent 500.

By adding the antistatic agent into the polarizing layer or/and the backplate layer, the embodiment of the present disclosure reduces an impedance value of the polarizing layer or/and the backplate layer, improves an antistatic effect, thereby improving overall photoelectric performances of the display module.

Specific embodiments are used to describe technical solutions of the present disclosure.

In the embodiment, the display module 100 includes the display panel 200, the polarizing layer 300 disposed on the first side 101 of the display panel 200, and the backplate layer 400 disposed on the second side 102 of the display panel 200.

In some embodiments, the display panel 200 includes an array substrate and a light-emitting functional layer.

In some embodiments, since resistances of the polarizing layer 300 or/and the backplate layer 400 are overly large, static electricity in the display panel 200 or other film layers cannot be exported successfully, thereby affecting overall photoelectric performances of the display module 100.

Referring to FIG. 1, the polarizing layer 300 or/and the backplate layer 400 includes the antistatic agent 500. In FIG. 1, the antistatic agent 500 being disposed in a first adhesive layer 310 is taken as an example, and it can be understood that the antistatic agent 500 may also be disposed in other film layers, which is not repeated in the figures herein. By adding the antistatic agent 500 into the polarizing layer 300 or/and the backplate layer 400, the present disclosure reduces the impedance value of the polarizing layer 300 or/and the backplate layer 400, improves the antistatic effect, thereby improving overall photoelectric performances of the display module 100. Therefore, product design and testing requirements can be satisfied.

In some embodiments, the antistatic agent 500 is disposed in a film layer of the polarizing layer 300 on one side adjacent to the display panel 200, or/and the antistatic agent 500 is disposed in a film layer of the backplate layer 400 on one side adjacent to the display panel 200.

Referring to FIGS. 1 and 2, when the antistatic agent 500 is closer to the display panel 200, it will cause a greater impact on the display panel 200, and correspondingly, a beneficial effect brought by this will be improved. By adding the antistatic agent 500 into the film layer of the polarizing layer 300 on the side adjacent to the display panel 200 or/and the film layer of the backplate layer 400 on the side adjacent to the display panel 200, resistances of the polarizing layer 300 or/and the backplate layer 400 can be reduced, and conductivity of the polarizing layer 300 or/and the backplate layer 400 can be increased. Therefore, an antistatic ability of the polarizing layer 300 and the backplate layer 400 can be improved, and the overall photoelectric performances of the display module 100 can be improved.

In some embodiments, referring to FIG. 2, the polarizing layer 300 includes a linear polarizing layer 350 and the first adhesive layer 310 disposed between the linear polarizing layer 350 and the display panel 200, and the antistatic agent 500 is disposed in the first adhesive layer 310; or/and the backplate layer 400 includes a protective layer 410 and a second adhesive layer 420 disposed between the protective layer 410 and the display panel 200, and the antistatic agent 500 is disposed in the second adhesive layer 420.

When the first adhesive layer 310 is tightly attached to the display panel 200 and the second adhesive layer 420 is tightly attached to the display panel 200, there will be a greatest impact on the display panel 200. By adding the antistatic agent 500 into the first adhesive layer 310 or/and the second adhesive layer 420, it will be more beneficial to reduce the resistances of the polarizing layer 300 or/and the backplate layer 400, and it will be more beneficial to increase the conductivity of the polarizing layer 300 or/and the backplate layer 400. Therefore, the antistatic ability of the polarizing layer 300 and the backplate layer 400 can be improved, and the overall photoelectric performances of the display module 100 can be improved.

When the antistatic agent 500 is not added to the first adhesive layer 310, a surface impedance value of the polarizing layer 300 ranges from $1.0*10^{13}$ $\Omega/m2$ to $1.0*10^{15}$ $\Omega/m2$. While after the antistatic agent 500 is added to the first adhesive layer 310, the surface impedance value of the polarizing layer 300 ranges from $1.0*10^{10}$ $\Omega/m2$ to $13.0*10^{11}$ $\Omega/m2$. When the antistatic agent 500 is not added to the second adhesive layer 420, a surface impedance value of the backplate layer 400 ranges from $1.0*10^{13}$ $\Omega/m2$ to $15.0*10^{13}$ $\Omega/m2$. While after the antistatic agent 500 is added to the second adhesive layer 420, the surface impedance value of the backplate layer 400 ranges from $1.0*10^{10}$ $\Omega/m2$ to $10.0*10^{11}$ $\Omega/m2$. It can be seen that adding the antistatic agent 500 into the first adhesive layer 310 or/and the second adhesive layer 420 can significantly reduce the resistances of the polarizing layer 300 or/and the backplate layer 400.

In some embodiments, referring to FIG. 2, in a direction from the linear polarizing layer 350 to the display panel 200, an amount of the antistatic agent 500 in the first adhesive layer 310 is gradually increased; or/and in a direction from the protective layer 410 to the display panel 200, an amount of the antistatic agent 500 in the second adhesive layer 420 is gradually increased.

A content of the antistatic agent 500 being more concentrated in the direction close to the display panel 200 can be beneficial to improve a performance of the display panel 200. For example, an antistatic performance of the display panel 200 can be improved, thereby improving a photoelectric performance of the display panel 200 and the overall photoelectric performances of the display module 100.

In some embodiments, referring to FIG. 1, the polarizing layer 300 includes the first adhesive layer 310 disposed on the display panel 200, a compensation layer 320 disposed on the first adhesive layer 310, a third adhesive layer 330 disposed on the compensation layer 320, a first support layer 340 disposed on the third adhesive layer 330, a linear polarizing layer 350 disposed on the first support layer 340, and a second support layer 360 disposed on the linear polarizing layer 350. Wherein, at least one film layer of the first adhesive layer 310, the compensation layer 320, the third adhesive layer 330, the first support layer 340, the linear polarizing layer 350, or the second support layer 360 is provided with the antistatic agent 500. In FIG. 1, the antistatic agent 500 being disposed in the first adhesive layer 310 is taken as an example, and it can be understood that the antistatic agent 500 may also be disposed in other film layers, which is not repeated in the figures herein.

In some embodiments, a mass percentage of the antistatic agent 500 in a corresponding film layer ranges from 0.5% to 2.0%. Only a small amount of the antistatic agent 500 is needed to realize optimization of the resistances of the backplate layer 400 or/and the polarizing layer 300.

In some embodiments, referring to FIG. 1, a thickness of the first adhesive layer 310 is greater than a thickness of the third adhesive layer 330, so that the antistatic agent 500 in the first adhesive layer 310 can have a better antistatic effect, that is, an effect of reducing resistances, thereby being better to improve the photoelectric performance of the display panel 200.

In some embodiments, a material of the first adhesive layer 310, the second adhesive layer 420, and the third adhesive layer 330 may be a pressure-sensitive adhesive (PSA) or other adhesive materials. A material of the first support layer 340 and the second support layer 360 may be cellulose triacetate (TAC) or cyclic olefin copolymer (COP), thereby protecting the linear polarizing layer 350. The second support layer 360 is disposed on a periphery of the polarizing layer 300, so the second support layer 360 may also be a hard coating to enhance protection. The linear polarizing layer 350 may be polyvinyl alcohol, which mainly plays a role of polarizing light. A material of the protective layer 410 may be cyclic olefin copolymer (COP) or polyethylene terephthalate (PET).

In some embodiments, the antistatic agent 500 includes hydrophilic groups.

The antistatic agent 500 being an organic silicon polymer is taken as an example, a long chain of the organic silicon polymer has an elastic spiral structure, and methyl groups of the organic silicon polymer are aligned to the air after thermal treatment, which has soft, lubricating, and waterproof functions. If the hydrophilic groups are introduced onto a macromolecular chain of the organic silicon polymer, the organic silicon polymer can have an antistatic effect, the resistances of the polarizing layer 300 or/and the backplate layer 400 can be reduced, and the conductivity of the polarizing layer 300 or/and the backplate layer 400 can be increased at a same time. Therefore, the antistatic ability of the polarizing layer 300 and the backplate layer 400 can be improved, and the overall photoelectric performances of the display module 100 can be improved.

In some embodiments, the antistatic agent 500 is one of an anionic surfactant, a cationic surfactant, an amphoteric surfactant, a non-ionic surfactant, or a silicone antistatic agent.

In some embodiments, the anionic surfactant is one of sodium alkyl sulfonate, sodium alkylbenzene sulfonate, alkyl sulfate, alkylphenol, polyvinyl chloride ether sulfate, or alkyl phosphate; the cationic surfactant is one of amine salts, quaternary ammonium salts, or alkyl amino acid salts; the amphoteric surfactant is one of amino acid type, betaine type, or imidazoline type; the non-ionic surfactant is ionic compounds containing hydroxyl or oxyethylene groups; and the silicone antistatic agent is one of copolymers of siloxane and polyoxyethylene ether, organosiloxane with sulfonic acid ends, organosiloxane with salt ends, or composite silicone.

Materials of the first adhesive layer 310, the second adhesive layer 420, and the third adhesive layer 330 are generally organic materials, so the material of the antistatic agent 500 being organic can be beneficial to mix them together, conveniently manufacture, and transport.

In some embodiments, antistatic functional groups of the antistatic agent 500 are positioned on ends of main chains of corresponding organic compounds, or the antistatic functional groups of the antistatic agent 500 are positioned on ends of branched chains of the corresponding organic compounds.

The antistatic agent 500 being the organosiloxane with sulfonic acid ends is taken as an example, the antistatic functional groups, that is, sulfonic acid groups, are positioned on ends of main chains or ends of branched chains of organosiloxane, which can reduce mutual influences between the sulfonic acid groups and other groups, and can allow an antistatic ability of the sulfonic acid groups to directly act on outside. Therefore, the antistatic ability can be enhanced, the resistances of the backplate layer 400 or/and the polarizing layer 300 can be better reduced, the antistatic ability of the polarizing layer 300 and the backplate layer 400 can be improved, and the overall photoelectric performances of the display module 100 can be improved.

In some embodiments, the array substrate includes an active layer disposed on a substrate, a first insulating layer disposed on the active layer, a gate electrode layer disposed on the first insulating layer, a second insulating layer disposed on the gate electrode layer, a source and drain electrode layer disposed on the second insulating layer, and a third insulating layer disposed on the source and drain electrode layer.

In some embodiments, the light-emitting device layer includes an anode layer disposed on the third insulating layer, a light-emitting material layer disposed on the anode layer, and a cathode layer disposed on the light-emitting material layer. The display panel 200 also includes a pixel definition layer disposed on a same layer as the light-emitting material layer, the polarizing layer 300 disposed on the light-emitting device layer, and a flexible coverplate disposed on the polarizing layer 300. The display panel 200 also includes corresponding adhesive layers disposed between the polarizing layer 300 and the flexible coverplate, between the light-emitting device layer and the polarizing layer 300, and between the backplate and the substrate.

In some embodiments, the display module 100 further includes a heat dissipation layer disposed on one side of the backplate layer 400 away from the display panel 200. The heat dissipation layer includes a heat dissipation body and an adhesive layer.

By adding the antistatic agent into the polarizing layer or/and the backplate layer, the embodiment of the present disclosure reduces the impedance value of the polarizing layer or/and the backplate layer, improves the antistatic effect, thereby improving the overall photoelectric performances of the display module.

Referring to FIG. 3, an embodiment of the present disclosure further provides a manufacturing method of the display module 100, which includes following steps:

S100: providing the linear polarizing layer 350;

S200: disposing the first adhesive layer 310 including the antistatic agent 500 on one side of the linear polarizing layer 350 to form the polarizing layer 300;

S300: providing the protective layer 410;

S400: disposing the second adhesive layer 420 including the antistatic agent 500 on one side of the protective layer 410 to form the backplate layer 400;

S500: providing the display panel 200; and

S600: attaching the first adhesive layer 310 of the polarizing layer 300 to the display panel 200 on the first side 101 of the display panel 200, and attaching the second adhesive layer 420 of the backplate layer 400 to the display panel 200 on the second side 102 of the display panel 200.

By adding the antistatic agent into the polarizing layer or/and the backplate layer, the embodiment of the present disclosure reduces the impedance value of the polarizing layer or/and the backplate layer, improves the antistatic effect, thereby improving the overall photoelectric performances of the display module.

Specific embodiments are used to describe technical solutions of the present disclosure.

In this embodiment, the manufacturing method of the display module 100 includes following steps:

S100: providing the linear polarizing layer 350.

In some embodiments, the antistatic agent 500 can be added into the linear polarizing layer 350.

In some embodiments, the linear polarizing layer 350 may be polyvinyl alcohol, which mainly plays a role of polarizing light.

S200: disposing the first adhesive layer 310 including the antistatic agent 500 on the side of the linear polarizing layer 350 to form the polarizing layer 300.

In some embodiments, the first adhesive layer 310 may be manufactured first and then be directly attached to the side of the linear polarizing layer 350. Step S200 includes following steps:

S210a: forming a first adhesive material film on a first substrate.

S220a: adding the antistatic agent 500 into the first adhesive material film to form the first adhesive layer 310.

In some embodiments, the antistatic agent 500 may also be added after the first adhesive layer 310 is formed on the side of the linear polarizing layer 350. The step S200 includes following steps:

S210b: disposing the first adhesive material film on the side of the linear polarizing layer 350.

S220b: adding the antistatic agent 500 into the first adhesive material film to form the first adhesive layer 310.

In some embodiments, in the direction from the linear polarizing layer 350 to the display panel 200, the amount of the antistatic agent 500 in the first adhesive layer 310 is gradually increased.

S300: providing the protective layer 410.

In some embodiments, the material of the protective layer 410 may be cyclic olefin copolymer (COP) or polyethylene terephthalate (PET).

S400: disposing the second adhesive layer 420 including the antistatic agent 500 on the side of the protective layer 410 to form the backplate layer 400.

In some embodiments, the second adhesive layer 420 may be manufactured first and then be directly attached to the side of the protective layer 410. Step S400 includes following steps:

S410a: forming a second adhesive material film on a second substrate.

S420a: adding the antistatic agent 500 into the second adhesive material film to form the second adhesive layer 420.

In some embodiments, the antistatic agent 500 may also be added after the second adhesive layer 420 is formed on the side of the protective layer 410. The step S400 includes following steps:

S410b: disposing the second adhesive material film on the side of the protective layer 410.

S420b: adding the antistatic agent 500 into the second adhesive material film to form the second adhesive layer 420.

In some embodiments, referring to FIG. 1, the polarizing layer 300 includes the first adhesive layer 310 disposed on the display panel 200, the compensation layer 320 disposed on the first adhesive layer 310, the third adhesive layer 330 disposed on the compensation layer 320, the first support layer 340 disposed on the third adhesive layer 330, the linear polarizing layer 350 disposed on the first support layer 340, and the second support layer 360 disposed on the linear polarizing layer 350. Wherein, at least one film layer of the first adhesive layer 310, the compensation layer 320, the third adhesive layer 330, the first support layer 340, the linear polarizing layer 350, or the second support layer 360 is provided with the antistatic agent 500.

In some embodiments, the mass percentage of the antistatic agent 500 in the corresponding film layer, that is, an adding amount of the antistatic agent 500, ranges from 0.5% to 2.0%. Only a small amount of the antistatic agent 500 is needed to realize optimization of the resistances of the backplate layer 400 or/and the polarizing layer 300.

In some embodiments, referring to FIG. 1, the thickness of the first adhesive layer 310 is greater than the thickness of the third adhesive layer 330, so that the antistatic agent 500 in the first adhesive layer 310 can have the better antistatic effect, that is, the effect of reducing resistances, thereby being better to improve the photoelectric performance of the display panel 200.

In some embodiments, the material of the first adhesive layer 310, the second adhesive layer 420, and the third adhesive layer 330 may be a pressure-sensitive adhesive (PSA) or other adhesive materials. The material of the first support layer 340 and the second support layer 360 may be cellulose triacetate (TAC) or cyclic olefin copolymer (COP), thereby protecting the linear polarizing layer 350. The second support layer 360 is disposed on the periphery of the polarizing layer 300, so the second support layer 360 may also be a hard coating to enhance protection. The linear polarizing layer 350 may be polyvinyl alcohol, which mainly plays a role of polarizing light. The material of the protective layer 410 may be cyclic olefin copolymer (COP) or polyethylene terephthalate (PET).

S500: providing the display panel 200.

In some embodiments, a specific structure of the display panel 200 can be referred to the description of the structure of the display panel 200 in the above embodiments, and will not be repeated herein.

S600: attaching the first adhesive layer 310 of the polarizing layer 300 to the display panel 200 on the first side 101 of the display panel 200, and attaching the second adhesive layer 420 of the backplate layer 400 to the display panel 200 on the second side 102 of the display panel 200.

In some embodiments, a bonding order of the backplate layer 400 and the polarizing layer 300 to the display panel 200 is not limited, and they may be attached to the display panel 200 at a same time.

In some embodiments, a specific structure of the antistatic agent 500 can be referred to the description of the structure of the antistatic agent 500 in the above embodiments, and will not be repeated herein.

By adding the antistatic agent into the polarizing layer or/and the backplate layer, the embodiment of the present disclosure reduces the impedance value of the polarizing layer or/and the backplate layer, improves the antistatic effect, thereby improving the overall photoelectric performances of the display module.

Referring to FIG. 4, an embodiment of the present disclosure further provides a mobile terminal 10, which includes any one of the display module 100 mentioned above and a terminal body 20, wherein, the terminal body 20 and the display module 100 are combined into one integrated structure.

A specific structure of the display module 100 can be referred to any one of the embodiments of the display module 100 and FIGS. 1 and 2, and will not be repeated herein.

In this embodiment, the terminal body 20 may include a middle frame, a sealant, etc., and the mobile terminal 10 may be a mobile display terminal, such as a mobile phone or a tablet, which is not limited herein.

The embodiments of the present disclosure provides the display module and the mobile terminal. The display module includes the display panel, the polarizing layer disposed on the first side of the display panel, and the backplate layer disposed on the second side of the display panel, and the polarizing layer or/and the backplate layer includes the antistatic agent. By adding the antistatic agent into the polarizing layer or/and the backplate layer, the embodiment of the present disclosure reduces the impedance value of the polarizing layer or/and the backplate layer, improves the antistatic effect, thereby improving the overall photoelectric performances of the display module.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A display module, comprising:
a display panel;
a polarizing layer disposed on a first side of the display panel;
and a backplate layer disposed on a second side of the display panel;
wherein the polarizing layer comprises an antistatic agent;
wherein the polarizing layer comprises a first adhesive layer disposed on the display panel, a compensation layer disposed on the first adhesive layer, a third adhesive layer disposed on the compensation layer, the antistatic agent is disposed in the first adhesive layer, and a thickness of the first adhesive layer is greater than that of the third adhesive layer;
wherein the first adhesive layer is directly attached to the first side of the display panel; and
wherein the antistatic agent is an organic silicon polymer having an elastic spiral structure.

2. The display module according to claim 1, wherein the antistatic agent is disposed in a film layer of the polarizing layer on one side adjacent to the display panel, or the antistatic agent is disposed in a film layer of the backplate layer on one side adjacent to the display panel.

3. The display module according to claim 2, wherein the polarizing layer comprises a linear polarizing layer; or
the backplate layer comprises a protective layer and a second adhesive layer disposed between the protective layer and the display panel, and the antistatic agent is disposed in the second adhesive layer.

4. The display module according to claim 3, wherein in a direction from the linear polarizing layer to the display panel, an amount of the antistatic agent in the first adhesive layer is gradually increased; or
in a direction from the protective layer to the display panel, an amount of the antistatic agent in the second adhesive layer is gradually increased.

5. The display module according to claim 1, wherein a first support layer is disposed on the third adhesive layer, a linear polarizing layer is disposed on the first support layer, and a second support layer is disposed on the linear polarizing layer; and at least one film layer of the compensation layer, the third adhesive layer, the first support layer, the linear polarizing layer, or the second support layer is provided with the antistatic agent.

6. The display module according to claim 1, wherein the antistatic agent comprises hydrophilic groups.

7. The display module according to claim 1, wherein a mass percentage of the antistatic agent in a corresponding film layer ranges from 0.5% to 2.0%.

8. A mobile terminal, comprising a display module and a terminal body, wherein the display module and the terminal body are combined into one integrated structure;

the display module comprises:

a display panel;

a polarizing layer disposed on a first side of the display panel;

and a backplate layer disposed on a second side of the display panel;

wherein the polarizing layer comprises an antistatic agent; and wherein the polarizing layer comprises a first adhesive layer disposed on the display panel, a compensation layer disposed on the first adhesive layer, a third adhesive layer disposed on the compensation layer, the antistatic agent is disposed in the first adhesive layer, and a thickness of the first adhesive layer is greater than that of the third adhesive layer;

wherein the first adhesive layer is directly attached to the first side of the display panel; and the antistatic agent is an organic silicon polymer having an elastic spiral structure.

9. The mobile terminal according to claim 8, wherein the antistatic agent is disposed in a film layer of the polarizing layer on one side adjacent to the display panel, or the antistatic agent is disposed in a film layer of the backplate layer on one side adjacent to the display panel.

10. The mobile terminal according to claim 9, wherein the polarizing layer comprises a linear polarizing layer; or the backplate layer comprises a protective layer and a second adhesive layer disposed between the protective layer and the display panel, and the antistatic agent is disposed in the second adhesive layer.

11. The mobile terminal according to claim 10, wherein in a direction from the linear polarizing layer to the display panel, an amount of the antistatic agent in the first adhesive layer is gradually increased; or in a direction from the protective layer to the display panel, an amount of the antistatic agent in the second adhesive layer is gradually increased.

12. The mobile terminal according to claim 8, wherein a first support layer is disposed on the third adhesive layer, a linear polarizing layer is disposed on the first support layer, and a second support layer is disposed on the linear polarizing layer; and at least one film layer of the compensation layer, the third adhesive layer, the first support layer, the linear polarizing layer, or the second support layer is provided with the antistatic agent.

13. The mobile terminal according to claim 8, wherein the antistatic agent comprises hydrophilic groups.

14. The mobile terminal according to claim 8, wherein a mass percentage of the antistatic agent in a corresponding film layer ranges from 0.5% to 2.0%.

* * * * *